US011442104B1

(12) United States Patent
Haimzon et al.

(10) Patent No.: US 11,442,104 B1
(45) Date of Patent: Sep. 13, 2022

(54) CONFIGURABLE INTEGRATED LOGIC ANALYZER

(71) Applicant: Marvell Asia Pte Ltd.

(72) Inventors: Avi Haimzon, Nes Ziona (IL); Ruven Torok, Cholon (IL)

(73) Assignee: Marvell Asia Pte, Ltd., Singapore (SG)

( * ) Notice: Subject to any disclaimer, the term of this patent is extended or adjusted under 35 U.S.C. 154(b) by 201 days.

(21) Appl. No.: 16/800,240

(22) Filed: Feb. 25, 2020

Related U.S. Application Data

(60) Provisional application No. 62/810,215, filed on Feb. 25, 2019.

(51) Int. Cl.
*G01R 31/3177* (2006.01)
*G01R 31/319* (2006.01)
*G01R 1/067* (2006.01)
*G01R 13/02* (2006.01)
*G01R 31/28* (2006.01)

(52) U.S. Cl.
CPC ..... *G01R 31/3177* (2013.01); *G01R 1/06766* (2013.01); *G01R 13/0254* (2013.01); *G01R 31/2889* (2013.01); *G01R 31/31903* (2013.01)

(58) Field of Classification Search
CPC ........ G01R 31/3177; G01R 31/318505; G01R 1/025; G01R 31/318342; G01R 31/318594; G01R 1/067; G01R 31/06766; G01R 31/318555; G01R 35/00; G01R 35/005; G01R 1/073; G01R 31/31813; G01R 31/318519; G01R 31/31907; G01R 31/3171; G01R 31/31917; G01R 1/06772; G01R 31/318502; G01R 31/318516; G01R 31/319; G01R 31/31901; G01R 31/31903; G01R 31/2889; G01R 13/0254; G01R 31/31937; H03K 19/177; H03K 19/17756; H03K 19/1776; G06F 11/3688; G06F 11/3055; G06F 11/323; G06F 11/3447; G06F 11/349; G06F 11/00; G06F 30/3312; G06F 9/3005; G06F 2212/1016; G06F 2213/0042
See application file for complete search history.

(56) References Cited

U.S. PATENT DOCUMENTS

| | | | | |
|---|---|---|---|---|
| 5,162,728 | A * | 11/1992 | Huppenthal | ......... G01R 31/316 439/482 |
| 5,771,240 | A * | 6/1998 | Tobin | ............... G01R 31/31705 714/724 |
| 6,460,148 | B2 * | 10/2002 | Veenstra | ................ G06F 11/25 714/39 |
| 7,225,359 | B2 * | 5/2007 | Beck | ............... G01R 31/31723 714/30 |

(Continued)

*Primary Examiner* — Vinh P Nguyen

(57) ABSTRACT

Methods and systems for collecting operational data from a target digital system are disclosed. In some embodiments, a method includes determining a test configuration to be used to configure a probe circuit. Determining the test configuration may include selecting one or more signal sources, defining one or more signal patterns within the selected signal sources, and defining one or more trigger events associated with the one or more signal patterns. Based on the test configuration, the probe circuit selects input/output (I/O) channels for a test cycle and captures one or more traces from the selected I/O channels during the test cycle.

26 Claims, 7 Drawing Sheets

(56) References Cited

U.S. PATENT DOCUMENTS

| | | | |
|---|---|---|---|
| 7,519,879 B2 * | 4/2009 | Woodward | G01R 31/3177 714/37 |
| 9,342,641 B1 * | 5/2016 | Backsen | G01R 31/3177 |
| 2004/0125139 A1 | 7/2004 | Beck et al. | |
| 2006/0041803 A1 | 2/2006 | Woodward et al. | |
| 2015/0355275 A1 | 12/2015 | LaVine | |
| 2015/0370234 A1 | 12/2015 | Lehane et al. | |
| 2018/0253368 A1 | 9/2018 | Villarreal et al. | |
| 2019/0026416 A1 | 1/2019 | Mahajan et al. | |
| 2019/0303268 A1 | 10/2019 | Ansari et al. | |

* cited by examiner

FIG. 4 ated within a UI display window;

FIG. 6 is a flow diagram depicting operations and functions performed by systems, devices, and components shown in FIGS. 1-5 for debugging an IC in accordance with some embodiments; and FIG. 7 depicts an example computer system that may be utilized to implement debugging and other logic analyzer operations according to some embodiments.

CONFIGURABLE INTEGRATED LOGIC ANALYZER

CROSS-REFERENCE TO RELATED PATENT APPLICATION

This disclosure claims the benefit of priority of U.S. Provisional Application Ser. No. 62/810,215 filed Feb. 25, 2019, titled, "METHOD AND APPARATUS USING A LOGIC ANALYZER TO DEBUG AN INTEGRATED CIRCUIT", the contents of which is incorporated herein by reference in its entirety.

BACKGROUND

The disclosure generally relates to digital device analysis and methods and systems for analyzing a variety of digital devices and systems.

Logic analyzers generally are devices that collect, process, and display sets of signals from a digital system or component such as a computer system or a circuit device. The collection, processing, and displaying of the sets of signals may be used for monitoring operational conditions of the digital system and for debugging. Logic analyzers typically are configured to convert collected data into formats that are utilized to interpret system behavior including operationally correlated functions. For example, a logic analyzer may be configured to convert collected operation data into state machine traces or timing diagrams. In this manner, logic analyzers enable display of timing and/or logic relationships between signals and corresponding components of a system or circuit.

A logic analyzer may be configured as a specialized hardware device and/or may be implemented as a programmed component within a universal computing platform such as a generalized host computer system. Logic analyzer design has evolved such that logic analyzers are particularly useful for displaying or otherwise rendering timing relationships or data on one or more buses such as address, data, and/or control buses. For debugging a digital device such as an integrated circuit (IC) component or a higher-level device such as a computer system, a logic analyzer can decode the information on internal buses and display or otherwise render the decoded information.

BRIEF DESCRIPTION OF THE DRAWINGS

Embodiments of the disclosure may be better understood by referencing the accompanying drawings.

FIG. 4 depicts pattern and trigger definition windows that are generated within a UI display window such as shown in FIG. 3 and utilized to generate test configurations in accordance with some embodiments;

DESCRIPTION

The description that follows includes example systems, methods, techniques, and program flows that embody aspects of the disclosure. However, it is noted that this disclosure may be practiced without these specific details. In some instances, well-known instruction instances, protocols, structures and techniques have not been shown in detail in order not to obfuscate the description.

Overview

Methods, systems, devices, and components are disclosed herein for analyzing digital devices such as discrete components and systems of digital components coupled to shared buses. In some embodiments, probe control functions are distributed between signal collection circuitry and an analyzer application that also implements signal analysis functions. In some embodiments, a logic analyzer includes a user interface (UI) that enables multiple input interface definition, multiple state machine definition, and multiple event trigger definition.

Example Illustrations

Figure 1:
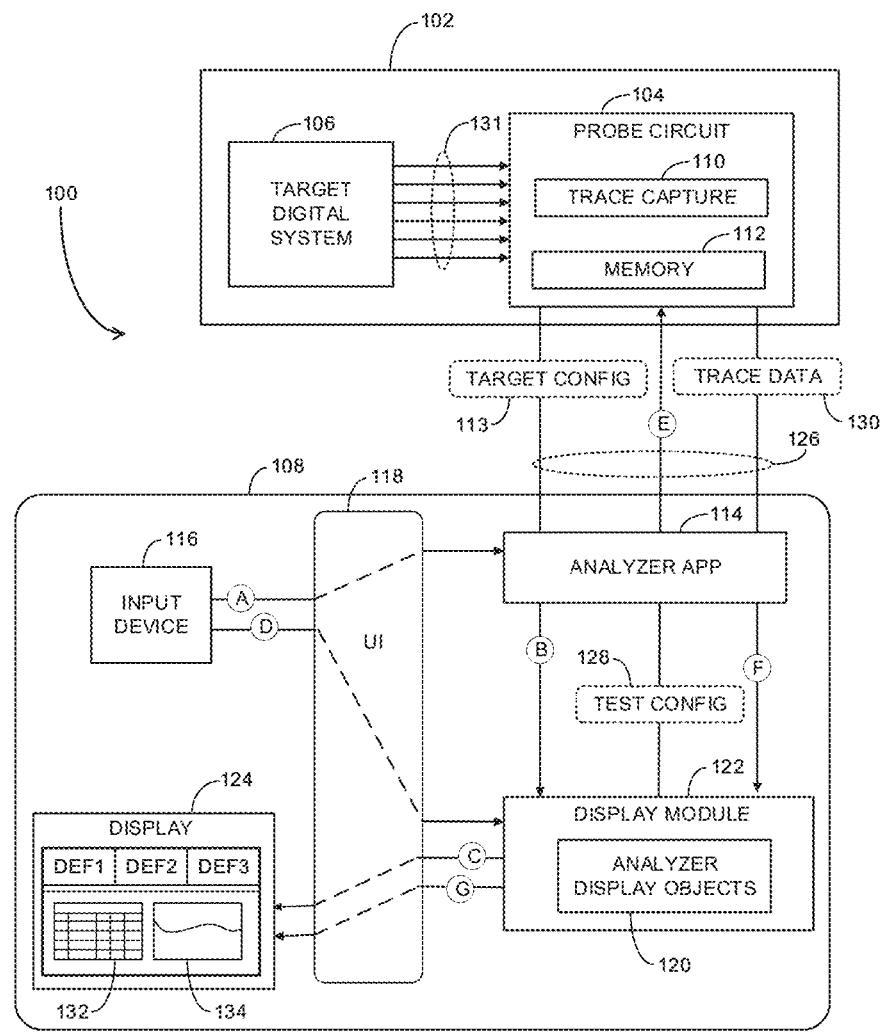
FIG. 1 is a block diagram illustrating a system for generating and rendering operational data for a target digital system in accordance with some embodiments.

FIG. 1 is a block diagram illustrating a system 100 for generating and rendering output data from a logic analyzer in accordance with some embodiments. System 100 includes an integrated circuit (IC) 102 and a client node 108. Client node 108 comprises a combination of hardware, firmware, and software configured to communicate with and implement analyzer transactions for IC 102. IC 102 includes, in part, a probe circuit 104 that is communicatively connected to a target digital system 106.

Probe circuit 104 comprises IC components including a trace capture circuit 110 and a memory circuit 112. Trace capture circuit 110 is configured to collect and record operational data from components within target digital system 106. The operational data may comprise time series traces and/or event-based data that is initially captured such as by one or more latches each of which captures a signal value within trace capture circuit 110 and recorded within memory circuit 112. For example, each time series trace may comprise a set of data inputs collected by the probe circuit and an associated time stamp. The event and trace data that has been collected is stored as entries within relational tables, which comprise multiple series of timestamp-value pairs stored in memory circuit 112.

An analyzer application 114 is loaded within the memory (not expressly depicted) of client node 108 and functions in coordination with probe circuit 104 to implement logic analyzer operations. Analyzer application 114 includes program instructions and data for configuring probe circuit 104 to implement test cycles for retrieving operational data based on user interface (UI) interactions. Client node 108 includes a user input device 116 such as a keyboard and/or display-centric input device such as a screen pointer device.

A user can use input device 116 to enter commands (e.g., displayed object select) or data that are processed via a UI layer 118 and received by the system and/or application software executing within the processor-memory architecture (not expressly depicted) of client node 108.

User input signals from input device 116 are translated as keyboard or pointer commands directed to analyzer application 114. In some embodiments, analyzer application 114 is configured, in part, to generate graphical objects, such as analyzer display objects 120 by a display module 122. Graphical representations of analyzer display objects 120 are rendered via UI layer 118 on a display device 124, such as a computer display monitor.

The following description is annotated with a series of letters A-G. These letters represent stages of operation for collecting and rendering operation data, such as time series trace data, for target digital system 106. Although sequentially ordered for this example, the stages illustrate one example to aid in understanding this disclosure and should not be used to limit the claims. Subject matter falling within the scope of the claims can vary with respect to the order and type of the operations.

At stage A, input device 116 transmits an input signal via UI layer 118 to analyzer application 114, directing the application to request updated system configuration information for target digital system 106. For instance, analyzer application 114 transmits such requests using a communication protocol that corresponds to an interface connection 126 between analyzer application 114 and the probe circuit 104 integrated within IC 102. In response to the request, probe circuit 104 retrieves configuration data for target digital system 106 at stage B. The configuration data may be new or updated configuration data such as by including updated connections to external components or being internally re-configured such as if target digital system 106 is or includes a re-programmed Field-Programmable Gate Array (FPGA). During stage B, the configuration data 113 for target digital system 106 is received by analyzer application 114 and rendered by display module 122.

At stage C, the updated target configuration data 113 is accessible for analyzer application 114 to render display objects 120 on display device 124, including definition objects DEF1, DEF2, and DEF3. The definition objects include data entry/selection objects that enable a multi-level determination of the signals that will be collected during a test cycle. For example, DEF1 includes data entry/selection objects that determine the signal sources, such as bus interfaces and state machines, from which signal will be collected. DEF2 includes data entry/selection objects that determine the signal patterns in terms of sets of individual signals within the determined sources that will be collected. DEF3 includes data entry/selection objects that determine the trigger events in terms of sets of one or more signals within target digital system 106 that will trigger collection of the signals.

At stage D, input device 116 transmits input signals corresponding to selection of objects and entry of data within input definition objects DEF1, DEF2, and DEF3. The object selection and data entry that are transmitted via UI layer 118 identify the operational data to be collected in terms of data source, data pattern, and/or trigger. The object selection(s) and data entry are received and proceeded by display module 122 to display the selections/entries. At stage E, the object selection(s) and data entry are processed by components of analyzer application 114 to transmit a test configuration 128 to probe circuit 104 via interface 126.

Based on data collection parameters in test configuration 128, probe circuit 104 implements one or more test collection cycles in which operational data, such as time series trace data 130, is collected from target digital system 106. Probe circuit 104 selects signals 131 within target digital system 106 to be captured such as via latches (not expressly depicted) within probe circuit 104. The trace data 130 is buffered or otherwise recorded in memory 112 and transmitted, at stage F, from probe circuit 104 to display module 122. At stage G, trace data 130 is displayed within display device 124 as one or more display objects such as a text-based object 132 and/or a graphical object 134. Text-based object 132 may be, for instance, an alphanumeric display such as a tabular display. Graphical object 134 may be, for instance, a signal diagram.

Figure 2:
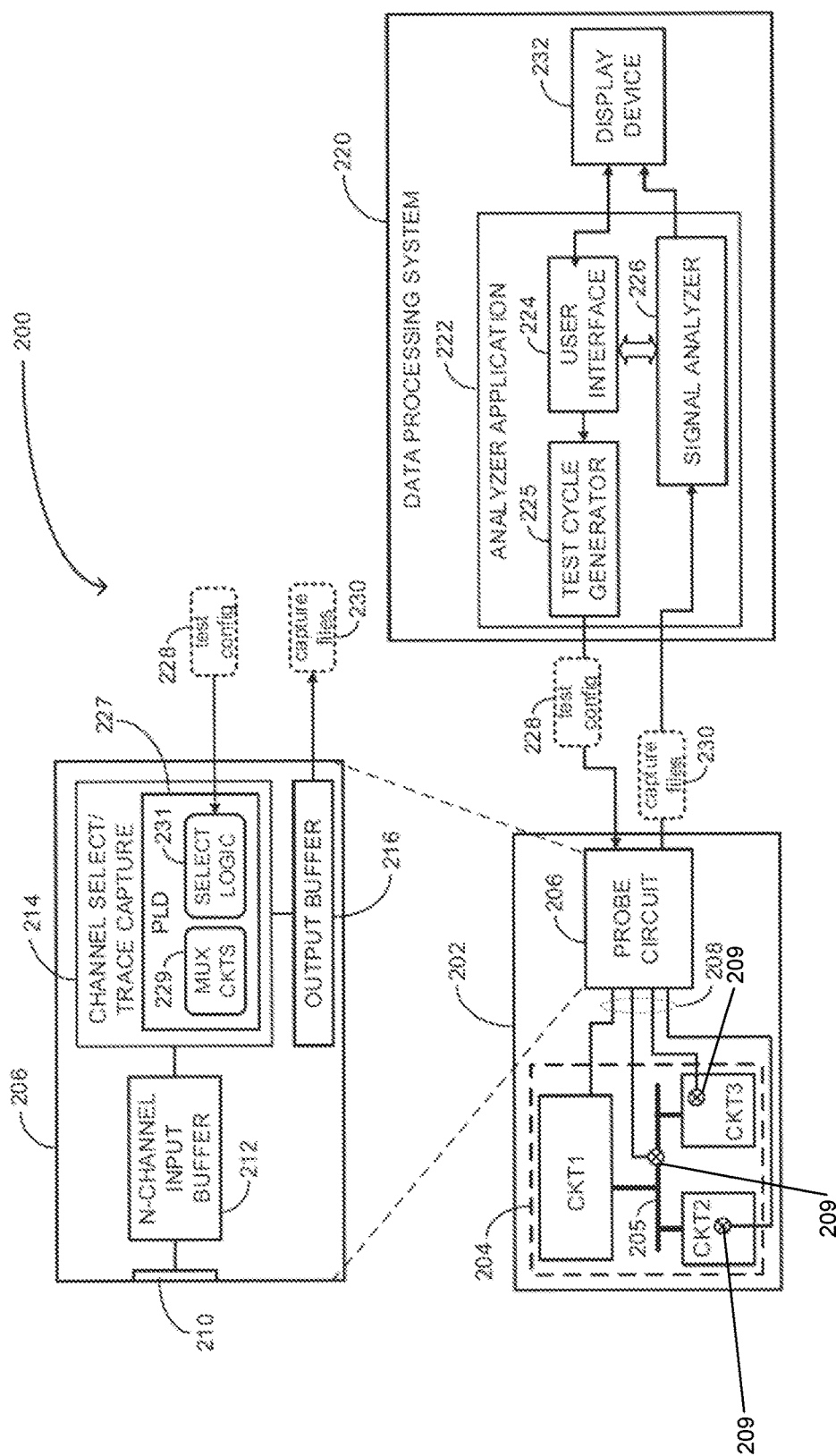
FIG. 2 is a block diagram depicting a system for implementing an integrated logic analyzer including a more detailed illustration of probe circuit and analyzer application components in accordance with some embodiments.

FIG. 2 is a block diagram depicting a system 200 for implementing a logic analyzer comprising a dynamically configurable probe and an analyzer application. System 200 includes an IC 202 comprising configurable probe components coupled to target system (i.e., system under test) components. System 200 further includes a data processing system 220 in which programmable analyzer components are utilized to configure the probe circuit to collect test data. IC 202 includes a target digital system 204 comprising at least three circuits CKT1, CKT2, and CKT3 interconnected by a bus 205. Target digital system 204 comprises any one or a combination of a variety of digital devices, components, and systems. For example, target digital system 204 may be a CPU, a memory device, a field-programmable logic device, and/or may comprise a combination of such devices such as a System-on-Chip (SoC).

A probe circuit 206 within IC 202 may be configured to function in one or more respects similarly to probe circuit 104. Probe circuit 206 is configured to implement a dynamically configurable probe function to implement test cycles in which operational data, such as in the form of signal traces, is collected from target digital system 204. As shown, probe circuit 206 includes I/O channels 208 that physically connect with respective signal source inputs from each of CKT1, CKT2, and CKT3 as well as bus 205. Example signal source input points 209 are shown for the circuits CKT2 and CKT3 and the bus 205 in FIG. 2. In the depicted embodiment, probe circuit 206 includes an input port interface 210 for receiving signals via I/O channels 208.

Probe circuit 206 further includes a channel select/trace capture circuit 214 that is configured to select sets of input source signals within portions of target digital system 204 via I/O channels 208. Channel select/trace capture circuit 214 includes signal select logic such as multiplexor circuits for selecting a subset of available signals from interface 210. While conceptually depicted as single components, probe circuit 206 and channel select/trace capture circuit 214 are distributed across multiple components having respective interfaces to receive respective subsets of I/O channels 208. Channel select/trace capture circuit 214 is configured to select subsets of I/O channels during a test cycle based, at least in part, on a test configuration such as test configuration 228. Test configuration 228 comprises signals translated from test configuration data generated by analyzer software executing within data processing system 220.

Channel select/trace capture circuit 214 is further configured to include trace capture components such as latch circuits that capture sets of signals based on test configuration 228. The latch circuits are configured to latch input based on an internal or external clock signal depending on the mode in which probe circuit 206 is operating. If operating in timing mode, the latches receive an internal clock within probe circuit 206. If operating in state mode, the latches receive an external clock signal that is synchronous with the data from target digital system 204. An output buffer circuit 216 within probe circuit 206 is configured to receive and temporarily store the captured data before being received by data processing system 220 as capture files 230.

Data processing system 220 includes hardware and software components configured to dynamically configure probe circuit 206 during test cycles. Probe circuit 206 is dynamically configured in accordance with test configuration data 228 that is received from an analyzer application 222 executing within data processing system 220. Test configuration data 228 is used to configure a programmable logic device 227 that includes select logic 229 and multiplexor circuits 231. The select logic 229 processes the test configuration data to determine and generate selection signals applied to the multiplexor circuits 231, enabling multiplexor circuits 231 to collect a set of data inputs as a trace defined by the text configuration. The distributed configuration mechanism provided by probe circuit in combination with analyzer application enables flexible dynamic configurability of the numerous potential signals and combination signals that may be implemented locally or remotely such as if data processing system 220 is communicatively coupled to probe circuit 206, in part, remotely via a network connection. Analyzer application 222 that may be configured to operate, in part, as described with reference to analyzer application 114. Analyzer application 222 is configured, using a combination of program instructions and data, to generate test configurations, such as test configuration 228. The test configurations are processed by probe circuit 206 during test cycles to select sets of signals to capture or otherwise record. The captured and recorded signals, referred to herein as trace data or time series trace data, are transmitted to or retrieved by data processing system 220, which may include signal processing components to evaluate operating conditions of components within target system 204. In some embodiments, the collected trace data is used by debugging components within data processing system 220 to diagnose fault conditions.

Analyzer application 222 includes a UI 224 that is configured, using a combination of program instructions and data, to generate and displayably render UI objects within a display device 232. As described and depicted in further detail with reference to FIGS. 3 and 4, the generated UI objects include hierarchically arranged display and interactive objects including window objects in which data is graphically and/or textually displayed. The generated UI objects further include data input objects configured to received data input from a UI device such as a keyboard or pointing device. For instance, the data input objects may include text input objects that receive external text input such as from a keyboard. The data input objects may also include selectable input objects such as pointer-selectable buttons, scroll bars, and menus configured to provide pre-stored data items to be selected and entered. The selectable pre-stored data may include system configuration data that describes a current configuration of buses, state machines, and other components of target digital system 104.

Test configuration data such as in the form of defined signal sources, defined signal patterns, and trigger patterns are collected via UI 224 after interactive entry via display device 232. The input selection and definition data is processed by a test configuration generator 225 within analyzer application 222 to generate test configurations, such as test configuration 228, that are transmitted to probe circuit 206 for test cycles. Following a probe configuration and trace collection sequence, the resultant capture files 230 are received by a signal analysis component 226 within analyzer application 222. Signal analysis component 226 includes components, configured using a combination of program instructions and data, to process the combination of data within capture files 230 such as may be displayed via UI 224 on display device 232. In some embodiments, signal analysis component 226 may be or include debugger components that process the capture file data to identify computational or operational errors within target digital system 204.

Embodiments such as those depicted in FIGS. 1 and 2 provide a configurable hardware-based probe and a programmed analyzer component mechanism for configuring the probe circuit in a manner that enables comprehensive, precise, and flexible trace results. Because channel select/trace capture circuit 214 is disposed on, and native to, the IC, signal traces and responses can be captured based on a remote command that is delivered over a wired or wireless interface. The resulting captured traces and response can then be provided to a remotely located analyzer such as analyzer application 222.

Figure 3:
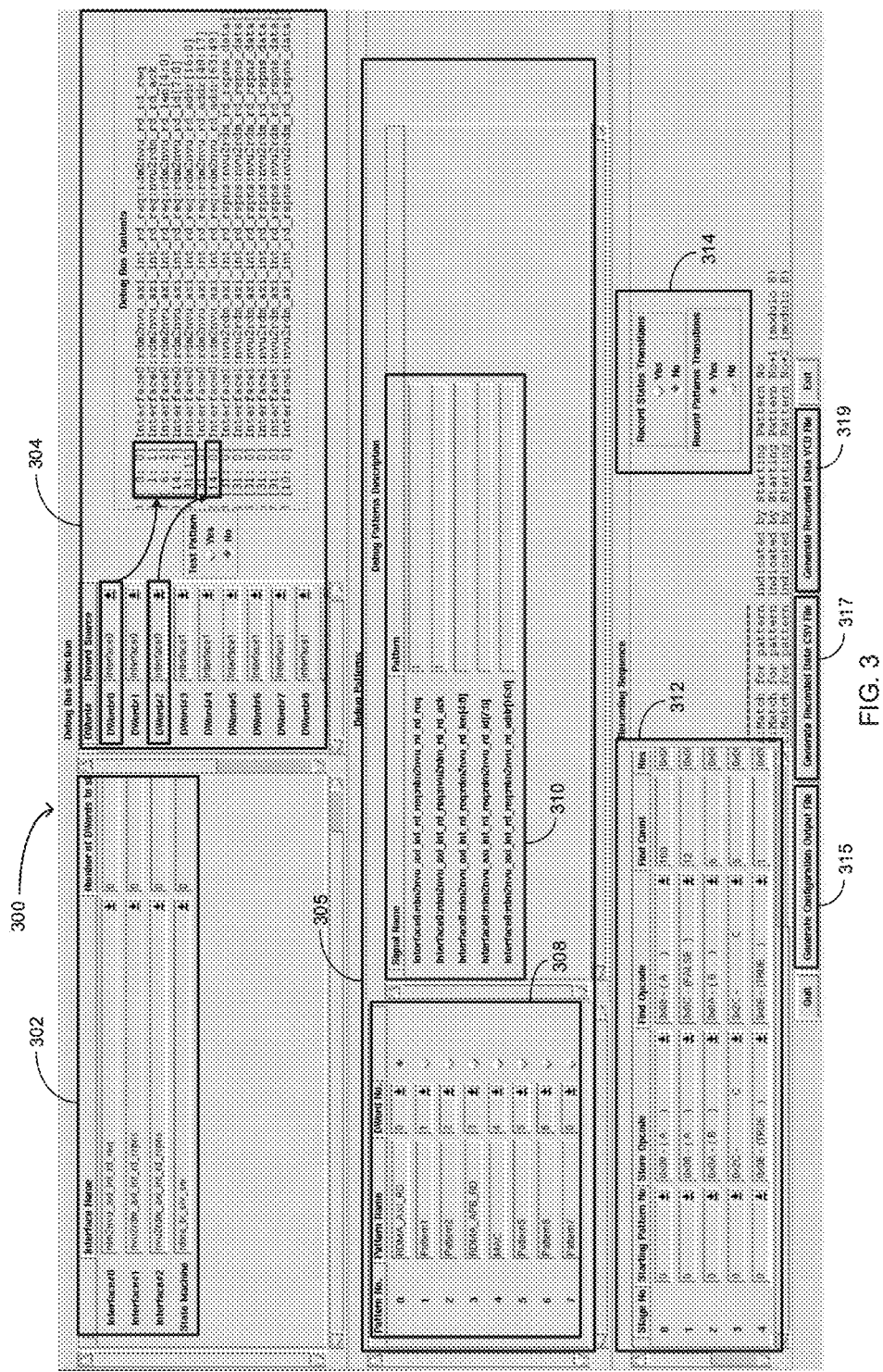
FIG. 3 illustrates a UI display window that may be implemented by an analyzer application such as depicted in FIGS. 1 and 2 and that includes test configuration definition objects for configuring a probe circuit in accordance with some embodiments.

FIG. 3 illustrates a UI display window 300 that includes test configuration definition objects for configuring a probe circuit and collecting and processing scan results over multiple phases of a test cycle in accordance with some embodiments. In the depicted embodiment, UI display window 300 is a debug configuration window that may be generated and displayed as depicted and described with reference to FIGS. 1 and 2. UI display window 300 includes child windows collectively configured to determine and generate a test configuration for a test cycle such as executed by probe circuits 104 and 206. UI display window 300 includes a source selection window 302 that includes data entry objects for receiving signal source identification data.

As shown, source selection window 302 includes three interface identifier (ID) objects, Interface #0, Interface #1, and Interface #2, each configured as drop-down list objects into which an alphanumeric interface ID can be entered during a test pattern definition phase of a test cycle. Each of the interface IDs identifies an interface that contains signals useful for debugging and other system diagnostics. Such interfaces may include register access interfaces, memory interfaces, CPU interfaces, a PCIe interfaces, RDMA interfaces, etc. Source selection window 302 further includes a state machine data entry object "State Machine" configured as a drop-down list object into which an alphanumeric state machine ID can be entered during the test pattern definition phase. The machine ID rdma_tx_slv_sm is an example ID that identifies a specific state machine that generates signals useful for debugging and other system diagnostics.

Further definition of a source signal connectivity set is provided by a signal selection window 304. Signal selection window 304 includes data entry objects configured to receive signal IDs for one or more signals within the interfaces and state machines selected within source selection window 302. Each of the data entry objects includes a signal name field, DWord #, that is associated with a respective set of selected signals that are entered in a DWord Interface Source field. For example, DWord #0 is associated with five selected signals [0: 0], [1: 1], [6: 2], [14; 7], and [31: 15] from within Interface0 and DWord #2 is associated with signal [14: 0] from within Interface0.

UI display window 300 further includes components that utilize the selected signal connections to define sets of signals and patterns of signal activity within those sets. To this end, UI display window 300 includes a pattern definition window 305 that includes graphical objects configured to define patterns of signals in terms of signal IDs and signal state/value. Pattern definition window 305 includes a pattern naming object 308 and a signal pattern object 310 that together receive and mutually associate signal connectivity information from source and signal selection windows 302 and 304. Pattern naming object 308 includes data entry objects having a number ID field, Pattern No., that specifies patterns IDs from 0 to 7. Associated with each pattern number is a name field, Pattern Name, that may be a text entry field into which an alphanumeric name is entered by an input device such as keyboard. For example, the pattern name entered in the data entry object having pattern number ID 5 is Pattern5.

In addition to and logically associated with a number ID and name, each data entry object includes one of the Dword number IDs previously utilized within signal selection window 304. For instance, the Dword # associated with the data entry object having pattern number ID 0 and name RDMA_AXI_RD is Dword 0, which has been selected via selection button for further pattern definition in signal pattern object 310. As shown, signal pattern object 310 includes entries having Signal Name fields containing the names of each of the five signals assigned within signal selection window 304 to DWord #0 Interface0. Each of the entries further includes a Pattern field in which a signal condition (e.g., asserted or unasserted) is entered for each corresponding signal name. For example, a "1" indicated asserted has been entered in the Pattern field for the first two entries thus indicating an overall pattern consisting of the IDs of the five signals with the first two signals asserted.

UI display window 300 further includes a trigger definition window 312 and an advanced trigger definition window 314 that utilize the selected signal connections within source and signal selection windows 302 and 304 and the pattern definitions within pattern definition window 305 to define trigger capture events in terms of the trigger event and the corresponding capture operations. Trigger definition window 312 includes multiple entries each having an associated stage number corresponding to a stage within an overall test sequence. Each entry further includes a Starting Pattern No field into which pattern numbers corresponding to the pattern numbers specified in pattern naming object 308 are entered. Specifically, each pattern number corresponds to the pattern number from the sequentially previous stage. Each entry of trigger definition window 312 further includes a Store Opcode field in which patterns IDs and operators are entered to define what information is to be captured for each trigger event cycle. Each entry further includes a Find Count field that specifies a number of occurrences of the Find Opcode condition to be detected to trigger capture. In some embodiments, trigger definition window 312 includes an entry object that specifies a rate of occurrences of the Find Opcode condition. Advanced trigger definition window 314 includes a selectable radio button objects for determining with state transitions and/or pattern transitions are to be captured/recorded during each stage in addition to the particularly specified signal conditions.

Figure 4:
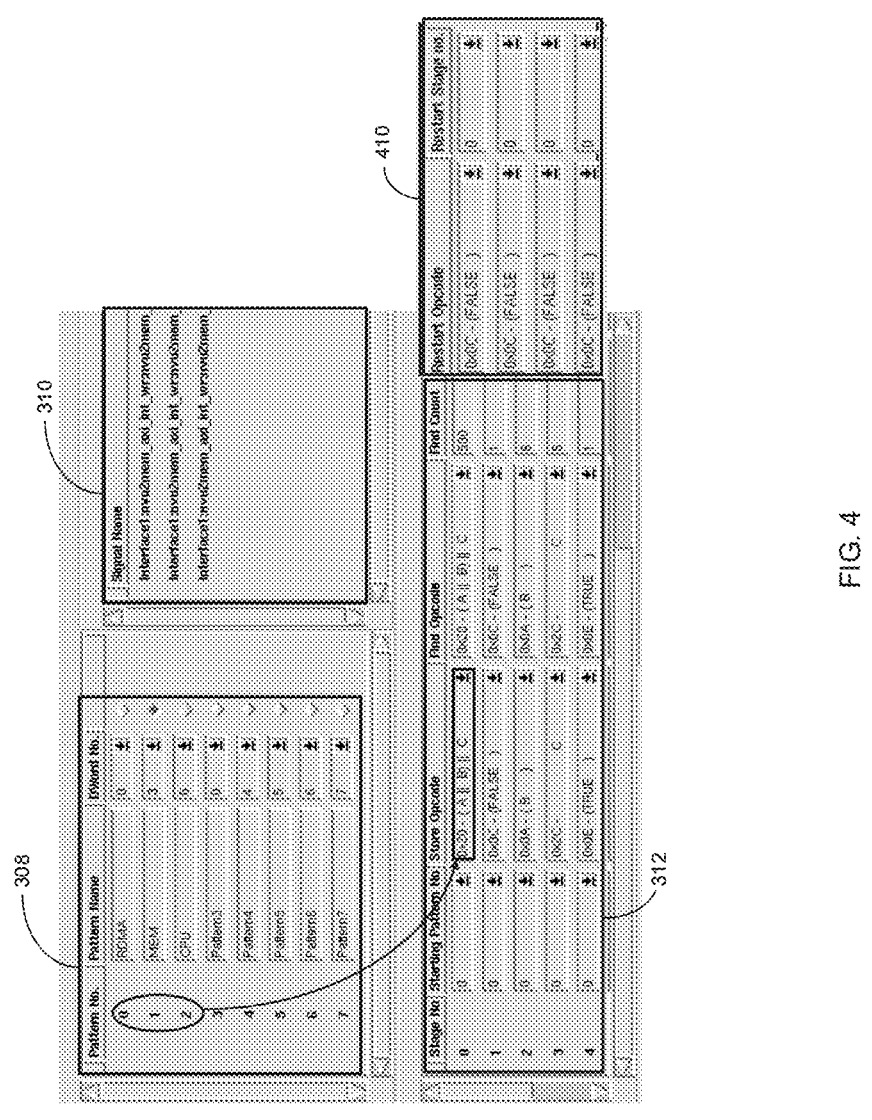

FIG. 4 depicts entries within trigger definition window 312 that correspond to pattern definition entries within pattern naming object 308 and signal pattern object 310. As shown in FIG. 4, the first three entries within pattern naming object 308 have pattern numbers 0, 1, and 2 that correspond to opcode operands A, B, and C, respectively. In this case, the stored opcode entry for the first entry (stage 0) within trigger definition window 312 specifies that the the operation (A∥B)∥C is a capture condition to be captured at stage 0. As further depicted, each entry includes an operational condition field, Find Opcode, that specifies the operation condition for capture. For instance, the stage 0 capture/store operation is conditioned on detecting the signal condition (A∥B)∥C. As further shown in FIG. 4, trigger definition window 312 is further associated with a trigger restart window 410 having entries that specify a restart operational condition within a Restart Opcode field that is associated with a particular associated stage number.

In the foregoing manner, test configurations such as depicted and described with reference to FIGS. 1 and 2 are generated that encode the interface, signal, pattern, and trigger event and capture information entered into UI display window 300. The test configurations are utilized to configure a probe circuit such as by the probe circuit reading a configuration file and self-configuring. The configured probe circuit executes test cycles to collect/capture trace data from the target digital system. The captured data is initially stored within the probe circuit and is accessed as streamed data subsequently by the analyzer application.

Figure 5:
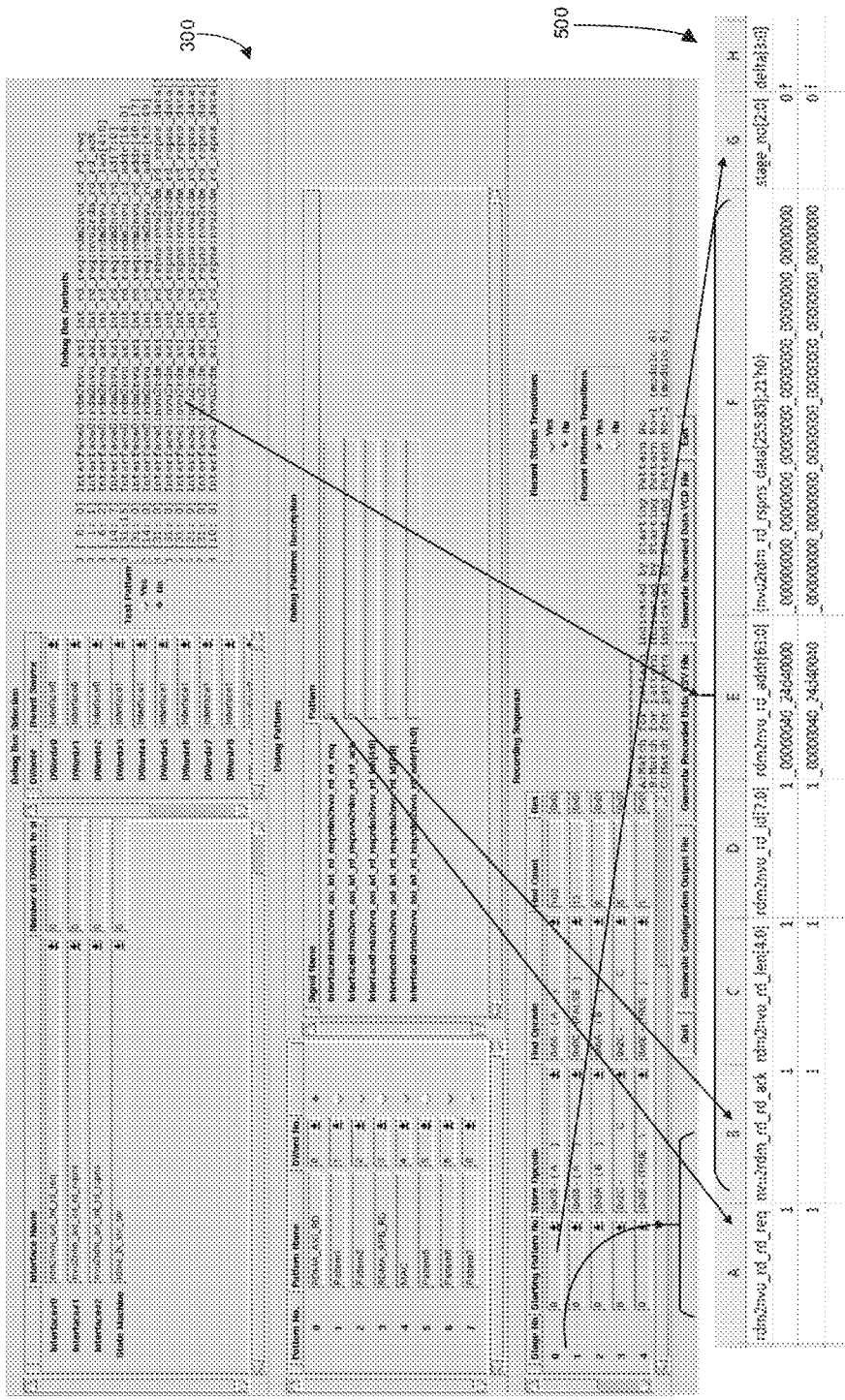
FIG. 5 illustrates a representative portion of a CSV formatted display that are generated within a UI display window containing data that is mapped from the input selection/definitions entered into a UI display window.

UI display window 300 further includes components for generating post test data that is useful for operational analysis such as debugging. For example, in response to selection of a configuration output request button 315 the analyzer application generates an output file containing the multi-layer test configuration information. The multi-layer test configuration information comprises trace data objects that are generated by the analyzer application and in which trace data is associated with signal pattern data and trigger event data within the test configuration. In such embodiments, the analyzer application displays the trace data objects including displaying the signal pattern data and trigger event data in association with the trace data. A pair of output display buttons 317 and 319 provide selectable alternatives for display formats for displaying the captured trace data. In response to selection of button 317, the analyzer application processes test data retrieved from the probe circuit to generate one or more files displaying the trace data in CVD text file format. In response to selection of button 319, the analyzer application processes test data retrieved from the probe circuit to generate one or more files displaying the trace data in VCD graphical file format. FIG. 5 illustrates a representative portion of a CSV display 500 containing data that is mapped (as shown by the depicted arrows) from the input selection/definitions entered into UI display window 300 into correspondingly labeled columns.

Figure 6:
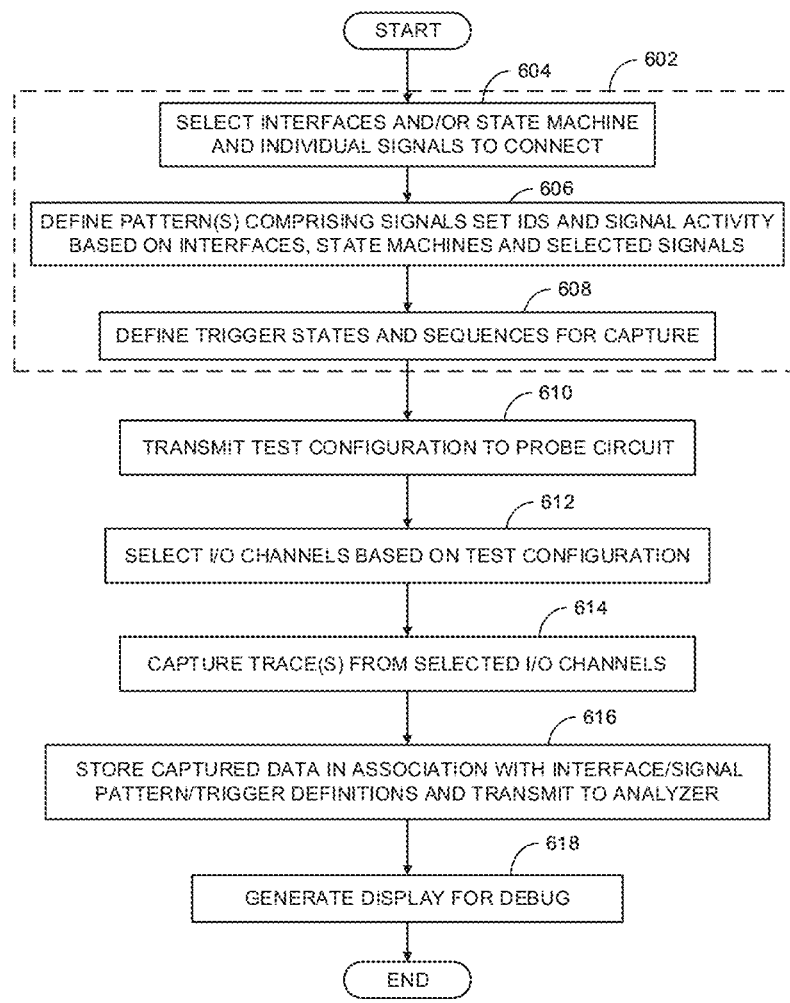

FIG. 6 is a flow diagram depicting operations and functions for debugging an IC in accordance with some embodiments. The operations and functions depicted and described with reference to FIG. 6 may be implemented by one or more components, devices, and systems depicted or described with reference to FIGS. 1-5. The process begins as shown at superblock 602 with a sequence of operations in which an analyzer UI utilized to define and generate a test configuration that is utilized to configure a probe circuit. At block 604, a source selection UI object is utilized to select or otherwise define one or more signal sources from a digital system under test by the probe circuit and associated analyzer software. The signal sources may include state machines and device interfaces such as memory and CPU interfaces that are selected by entered source IDs within the source selection UI object. Based on the selected signal sources, sets of signals generated by or otherwise associated with the sources are selected by using a signal selection UI object. Each signal has a signal ID that is associated by the signal selection UI object with a corresponding interface ID and an interface sub-identifier such as the DWord # sub-identifiers depicted and described with reference to signal selection window 304.

Determination of the test configuration continues at block 606, at which a pattern naming object and signal pattern object are utilized to define signal patterns. The pattern naming object is utilized to enter one or more alphanumeric or otherwise coded pattern names that are each associated by the pattern naming object with a corresponding signal set source ID (e.g., interface ID) and subset ID (e.g., DWord #). For each of the patterns, the signal pattern object associates the set of signals specified via the source ID and subset ID with a signal condition or value such as asserted/non-asserted. Determination of the test configuration concludes at block 608, at which a trigger definition object is utilized to define trigger events. Each trigger event may include a sets of signals to be captured based on the defined patterns and on relations of those patterns as defined by the trigger definition object. For example, the trigger definition object may specify signal patterns to capture/store that are a logical function of two or more signal patterns defined at block 606. The trigger definition object further defines the operational conditions under which the signals are captured that may also be logical functions of two or more of the signal patterns.

After being defined such as via an analyzer UI, the determined test configuration is generated in a suitable format to be interpreted and is provided to a configurable probe circuit (block 610). At block 612, the probe circuit configures a programmable logic device including selecting I/O channels based on the signal connectivity selected at block 604. The signal connectivity selected at block 604 specifies the particular capture condition or capture operation comprising signals/signal sources, the value patterns of the signals, and the trigger event(s) that initiates capture of the signal traces. At block 614, the probe configures internal trace logic based on the signal patterns and trigger definitions obtained at blocks 606 and 608 to capture signal trace data from the digital system under test. A signal trace capture operation is an operation in which one or more signals are captured by the probe circuit via the I/O channels configured per the test configuration. The signal that is captured is processed as indicated at block 616, with the probe circuit generating a write command list based on the test configuration. The write command list is used to store each resultant trace signal capture in local memory in association with the corresponding interface/signal pattern/trigger definitions before transmitting, such as via streaming, the data to the analyzer application. The process concludes at block 618 with the analyzer application or an external signal analyzer reading and displaying the capture data in text and/or graphical format.

Figure 7:
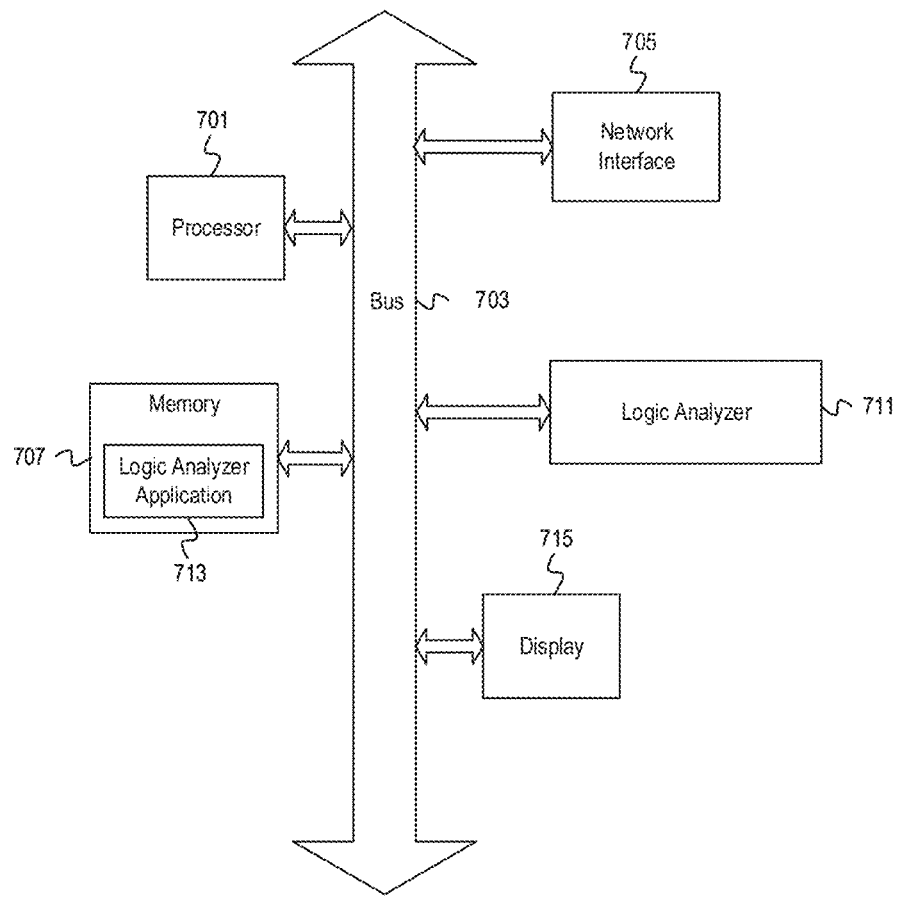

FIG. 7 depicts an example computer system that may be utilized to implement debugging and other logic analyzer operations according to some embodiments. The computer system includes a processor 701 (possibly including multiple processors, multiple cores, multiple nodes, and/or implementing multi-threading, etc.). The computer system includes a memory 707. The memory 707 may be system memory (e.g., one or more of cache, SRAM, DRAM, eDRAM, EEPROM, NRAM, etc.) or any one or more of the above already described possible realizations of machine-readable media. The computer system also includes a bus 703 (e.g., PCI, ISA) and a network interface 705.

The computer system includes a logic analyzer comprising a configurable probe circuit 711 in combination with an analyzer application 713 that is loaded within a memory device 707. Probe circuit 711 may be coupled with a system bus 703 via a suitable signal interface through which communications may be performed between probe circuit 711 and analyzer application 713. For example, the analyzer application 713 may comprise instructions executable by a processor 701. Any one of the previously described functionalities may be partially (or entirely) implemented in hardware and/or on the processor 701. For example, the functionality may be implemented with an application specific integrated circuit, in logic implemented in the processor 701, in a co-processor on a peripheral device or card, etc. Additional realizations may include fewer or more components not expressly illustrated in FIG. 7 (e.g., video cards, audio cards, additional network interfaces, peripheral devices, etc.). The processor 701 and the network interface 705 are coupled to the bus 703. Although illustrated as being coupled to the bus 703, the memory 707 may be coupled to the processor 701.

Aspects of the disclosure may be embodied as a system, method or program code/instructions stored in one or more machine-readable media. Use of the phrase "at least one of" preceding a list with the conjunction "and" should not be treated as an exclusive list and should not be construed as a list of categories with one item from each category, unless specifically stated otherwise.

The invention claimed is:

1. A method for analyzing operation of a target circuit within an integrated circuit, the integrated circuit comprising the target circuit and a probe circuit, the method comprising:
   determining a test configuration for analyzing operation of the target circuit comprising
      selecting one or more signal source input points within the target circuit to monitor,
      defining one or more signal patterns of the one or more signal source input points to detect, and
      defining one or more trigger events in association with the one or more signal patterns and in response to which to trigger capturing one or more signal traces from the one or more signal source input points;
   transmitting a test configuration signal indicating the test configuration to the probe circuit to select one or more channels, disposed between the probe circuit and the target circuit, from which to capture the one or more signal traces for a test cycle of the target circuit;
   receiving the captured one or more signal traces from the probe circuit; and
   analyzing operation of the target circuit based on the captured one or more signal traces.

2. The method of claim 1, further comprising generating the test configuration signal indicative of a respective selected set of signals for each of the selected one or more signal patterns,
   wherein each of the one or more trigger events is based on detection of states of signals, in one of the selected sets of signals, having one of the one or more signal patterns.

3. The method of claim 2, further comprising selecting the one or more channels for the test cycle based on the selected sets of signal.

4. The method of claim 2, further comprising selecting the sets of signals by, for each signal in the selected sets of signals, providing in the test configuration signal a signal identifier and an interface identifier.

5. The method of claim 4, further comprising:
   defining the one or more signal patterns by associating each of the selected sets of signals with a pattern identifier, each of the pattern identifiers identifying a respective pattern condition based on which to capture traces of the corresponding selected set of signals; and in response to detecting occurrence of one of the pattern conditions, initiating capturing of traces of each of the signals in the corresponding selected set of signals associated with the pattern identifier of the detected pattern condition, the detected pattern condition referring to a predetermined set of values respectively of the corresponding selected set of signals.

6. The method of claim 5, further comprising defining the one or more trigger events by indicating at least one of an occurrence number or an occurrence rate of each of the pattern conditions in response to which to capture traces of the selected sets of signals.

7. The method of claim 1, further comprising generating the test configuration signal to include trace data objects associating i) the one or more signal traces to capture with ii) signal pattern data and trigger event data, the one or more signal traces being captured based on the signal pattern data and the trigger event data.

8. The method of claim 7, further comprising displaying the trace data objects including the one or more signal patterns and the trigger event data in association with the one or more signal traces.

9. A logic analyzer comprising:
a memory configured to store an analyzer application; and
a processor configured to
execute the analyzer application to provide a user interface comprising user interface objects, and generate a test configuration signal based on the user interface objects indicating a test configuration including i) a selected one or more signal source input points of an integrated circuit; ii) a defined one or more signal patterns of the selected one or more signal source input points to detect; and iii) a defined one or more trigger events in association with the one or more signal patterns in response to which to trigger capturing one or more signal traces from the one or more signal source input points,
transmit the test configuration signal including the test configuration to a probe circuit implemented in the integrated circuit, to select one or more channels, disposed between the probe circuit and a target circuit, from which to capture the one or more signal traces for a test cycle of the target circuit,
receive the captured one or more signal traces from the probe circuit, and
analyze operation of the target circuit based on the one or more signal traces.

10. The logic analyzer of claim 9, wherein:
the analyzer application comprises one or more instructions for generating the test configuration signal indicative of a respective selected set of signals for each of the one or more signal patterns; and
each of the one or more trigger events being based on detection of states of signals, in one of the selected sets of signals, having one of the one or more signal patterns.

11. The logic analyzer of claim 10, wherein the analyzer application comprises one or more instructions for selecting the one or more channels for the test cycle based on the selected sets of signals.

12. The logic analyzer of claim 10, wherein the analyzer application comprises one or more instructions for selecting the sets of signals by, for each signal in the selected sets of signals, providing in the test configuration signal a signal identifier and an interface identifier.

13. The logic analyzer of claim 12, wherein the analyzer application is comprises one or more instructions to:
define the one or more signal patterns by associating each of the selected sets of signals with a pattern identifier, each of the pattern identifiers identifying a respective pattern condition based on which to capture traces of the corresponding selected set of signals; and
in response to detecting occurrence of one of the pattern conditions, initiate capture of traces of each of the signals in the corresponding selected set of signals associated with the pattern identifier of the detected pattern condition, the detected pattern condition referring to a predetermined set of values respectively of the corresponding selected set of signals.

14. The logic analyzer of claim 13, wherein the analyzer application comprises one or more instructions to define the one or more trigger events by indicating at least one of an occurrence number or an occurrence rate of each of the pattern conditions in response to which to capture traces of the selected sets of signals.

15. The logic analyzer of claim 13, wherein each of the pattern identifiers includes alphanumeric characters identifying a respective one of the one or more signal patterns.

16. The logic analyzer of claim 12, wherein, for each signal in the selected sets of signals,
the signal identifier includes alphanumeric characters identifying at least one of i) the signal in the selected set of signals, or ii) a selected signal source input point in the target circuit or a corresponding channel from which the signal in the selected sets of signals is captured; and
the interface identifier includes alphanumeric characters identifying an interface of the integrated circuit from which to capture the signal in the selected sets of signals.

17. The logic analyzer of claim 9, wherein the analyzer application comprises one or more instructions to generate the test configuration signal to include trace data objects, associating i) the one or more signal traces to capture with ii) signal pattern data and trigger event data, the one or more signal traces being captured based on the signal pattern data and the trigger event data.

18. The logic analyzer of claim 17, further comprising a display, wherein:
the analyzer application comprises one or more instructions to display, on the display; and
the trace data objects include displaying the one of the one or more signal patterns and the trigger event data in association with the one or more signal traces.

19. The logic analyzer of claim 9, wherein the analyzer application comprises one or more instructions to generate the test configuration signal to indicate a number of times to detect each of the one or more signal patterns.

20. The system of claim 19, wherein the logic analyzer comprises a user interface configured to control occurrence of the trigger events by indicating patterns of signal states to detect within the target circuit; and
the probe circuit is configured to trigger capturing of the one or more signal traces from the one or more signal source input points in response to detecting the patterns of signal states.

21. The logic analyzer of claim 9, wherein the analyzer application comprises one or more instructions to generate the test configuration signal to indicate whether to repeat the one or more trigger events.

22. A system comprising:
the logic analyzer of claim 9; and the integrated circuit comprising the target circuit and the probe circuit.

23. An integrated circuit comprising:

a target circuit comprising a plurality of circuit elements and having a target configuration of signal source input points, the target configuration preconfigured for remote and selective capturing of signal traces of the plurality of circuit elements; and a probe circuit configured to i) generate a target configuration signal indicative of the target configuration, ii) transmit the target configuration signal to a logic analyzer separate from the integrated circuit, iii) receive a test configuration signal from the logic analyzer indicating a) which selected ones of the signal source input points from which to monitor signals, b) patterns of states of the signals to detect, and c) definitions of conditional trigger events in response to which traces of the signals are to be captured, iv) detect the patterns of states of the signals at the signal source input points and in response to the conditional trigger events, capture the traces of the signals according to the test configuration signal, and v) transmit trace data of the captured traces to the logic analyzer.

24. The system of claim 23, wherein the probe circuit comprises:

a plurality of programmably configurable channels that couple the target circuit with the probe circuit; and programmable logic device configured to select one or more of the plurality of programmably configurable channels based on the test configuration signal.

25. A system comprising:

the integrated circuit of claim 24; and the logic analyzer.

26. The system of claim 25, wherein the logic analyzer comprises:

a user interface configured to define the patterns of the captured signals and the conditional trigger events; and a test cycle generator configured to generate the test configurations signal indicative of the patterns of the captured signals and the conditional trigger events.

* * * * *